(12) United States Patent
Sumiya et al.

(10) Patent No.: US 11,613,826 B2
(45) Date of Patent: Mar. 28, 2023

(54) SYNTHETIC SINGLE CRYSTAL DIAMOND

(71) Applicant: Sumitomo Electric Industries, Ltd., Osaka (JP)

(72) Inventors: Hitoshi Sumiya, Osaka (JP); Kensei Hamaki, Osaka (JP); Minori Teramoto, Osaka (JP); Katsuko Yamamoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 330 days.

(21) Appl. No.: 16/756,553

(22) PCT Filed: Aug. 2, 2018

(86) PCT No.: PCT/JP2018/029001
§ 371 (c)(1),
(2) Date: Apr. 16, 2020

(87) PCT Pub. No.: WO2019/077844
PCT Pub. Date: Apr. 25, 2019

(65) Prior Publication Data
US 2020/0283927 A1 Sep. 10, 2020

(30) Foreign Application Priority Data
Oct. 20, 2017 (JP) .............................. JP2017-203412

(51) Int. Cl.
*C01B 32/25* (2017.01)
*C30B 29/04* (2006.01)
(Continued)

(52) U.S. Cl.
CPC .............. *C30B 29/04* (2013.01); *C01B 32/25* (2017.08); *C30B 9/10* (2013.01); *C30B 33/02* (2013.01);
(Continued)

(58) Field of Classification Search
CPC ......... C30B 29/04; C30B 33/02; C30B 33/04; C01B 32/25; C01B 32/28
See application file for complete search history.

(56) References Cited

U.S. PATENT DOCUMENTS

| 4,880,613 A | 11/1989 | Satoh et al. |
| 2005/0211159 A1* | 9/2005 | Meguro ................. C30B 25/18 117/68 |

(Continued)

FOREIGN PATENT DOCUMENTS

| EP | 0327111 A2 | 8/1989 |
| GB | 2492822 A | 1/2013 |

(Continued)

OTHER PUBLICATIONS

Xie et al., Synthesis and characterization of high quality {100} diamond single crystal, J Mater Sci: Mater Electron (2017) 28:9813-9819—DOI 10.1007/s10854-017-6735-7 (Year: 2017).*

(Continued)

*Primary Examiner* — Hoa (Holly) Le
(74) *Attorney, Agent, or Firm* — Faegre Drinker Biddle & Reath LLP

(57) ABSTRACT

Provided is a synthetic single crystal diamond containing nitrogen atoms at a concentration of more than 600 ppm and 1500 ppm or less. The Raman shift $\lambda'$ (cm$^{-1}$) of a peak in a primary Raman scattering spectrum of the synthetic single crystal diamond and the Raman shift $\lambda$ (cm$^{-1}$) of a peak in a primary Raman scattering spectrum of a synthetic type IIa single crystal diamond containing nitrogen atoms at a content of 1 ppm or less satisfy the following expression (1):

$$\lambda' - \lambda \geq -0.10 \qquad (1).$$

3 Claims, 1 Drawing Sheet

(51) Int. Cl.
*C30B 9/10* (2006.01)
*C30B 33/02* (2006.01)
*C30B 33/04* (2006.01)

(52) U.S. Cl.
CPC .......... *C30B 33/04* (2013.01); *C01P 2002/54* (2013.01); *C01P 2002/82* (2013.01); *C01P 2006/90* (2013.01)

(56) References Cited

U.S. PATENT DOCUMENTS

| | | | |
|---|---|---|---|
| 2008/0311023 A1* | 12/2008 | Yamamoto | C30B 25/105 |
| | | | 423/446 |
| 2013/0192144 A1 | 8/2013 | Twitchen et al. | |
| 2013/0205680 A1* | 8/2013 | Twitchen | C30B 29/04 |
| | | | 51/307 |
| 2014/0065424 A1* | 3/2014 | Boudou | C09K 11/65 |
| | | | 423/446 |
| 2018/0141818 A1* | 5/2018 | Yamamoto | C01B 32/25 |

FOREIGN PATENT DOCUMENTS

| | | |
|---|---|---|
| JP | H02-385 A | 1/1990 |
| JP | H11-71197 A | 3/1999 |
| JP | 2005-272191 A | 10/2005 |
| JP | 2013-028492 A | 2/2013 |
| JP | 2015-134718 A | 7/2015 |
| WO | WO-2016/073233 A1 | 5/2016 |
| WO | WO-2016203950 A1 * 12/2016 ................ B01J 3/06 |

OTHER PUBLICATIONS

A T Collins, "Vacancy enhanced aggregation of nitrogen in diamond," Journal of Physics C: Solid State Physics, the Institute of Physics, UK, 1980, No. 13, p. 2641-50.

* cited by examiner

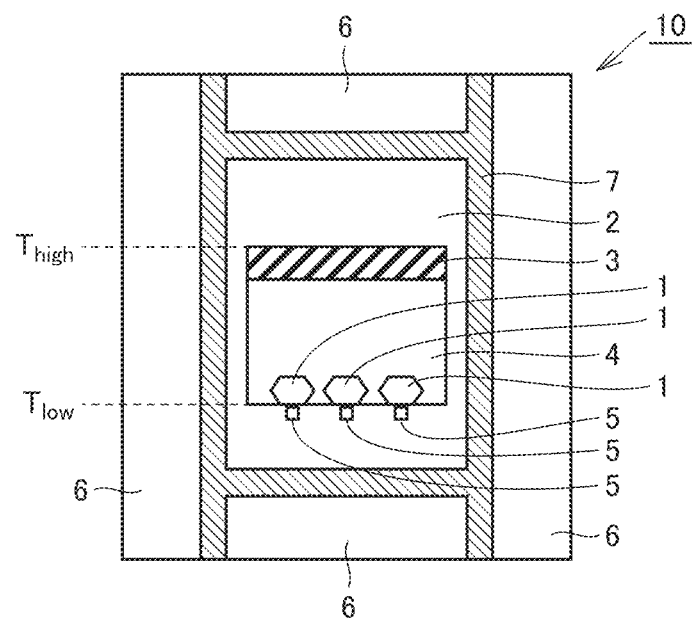

SYNTHETIC SINGLE CRYSTAL DIAMOND

TECHNICAL FIELD

The present disclosure relates to a synthetic single crystal diamond. The present application claims the benefit of priority to Japanese Patent Application No. 2017-203412 filed on Oct. 20, 2017, the entire contents of which are incorporated herein by reference.

BACKGROUND ART

Since single crystal diamond has high hardness, it has been widely used in tools such as cutting tools, grinding tools, and anti-wear tools. Single crystal diamond used in tools includes natural diamond and synthetic diamond.

Most of the natural diamonds (type Ia diamond) contain aggregated nitrogen atoms as impurities. Aggregated nitrogen atoms in the diamond crystal can inhibit the plastic deformation and/or the development of cracks when the diamond is used in a tool. Therefore, natural diamond has high mechanical strength. However, since natural diamond varies greatly in quality and the supply thereof is not stable, there is a great risk in using natural diamond in the industrial field.

On the contrary, synthetic diamond is constant in quality and may be supplied stably, and thereby is widely used in the industrial field.

Generally, synthetic diamond (type Ib diamond) contains isolated substitutional nitrogen atoms as impurities. It is known that the mechanical properties of diamond will deteriorate as the concentration of isolated substitutional nitrogen atoms in diamond crystals increases. Therefore, when type Ib synthetic diamond is used in a tool, the cutting edge thereof is likely to be worn or chipped off.

Further, some synthetic diamonds (type IIa diamond) contain almost no nitrogen impurities. Since type IIa synthetic diamond does not contain impurities or crystal defects that can inhibit the plastic deformation and the progress of cracks, when it is used in a tool, the cutting edge of the tool is likely to be chipped off.

Therefore, studies have been carried out on techniques for improving wear resistance and chipping resistance in synthetic diamonds.

For example, PTL 1 (Japanese Patent Laying-Open No. 2015-134718) discloses a technique for improving the toughness and wear resistance of a diamond by irradiating type Ib synthetic diamond material with an electron beam or a neutron beam to form isolated vacancy defects in the diamond material and annealing the diamond material thereafter.

Also, NPL 1 (A T Collins, Vacancy enhanced aggregation of nitrogen in diamond, Journal of Physics C: Solid State Physics, the Institute of Physics, U K, 1980, No. 13, p 2641-50) discloses a technique in which after type Ib synthetic diamond material is irradiated with an electron beam, a heat treatment is performed to convert isolated substitutional nitrogen atoms in the crystal into aggregated nitrogen atoms.

CITATION LIST

Patent Literature

PTL 1: Japanese Patent Laying-Open No. 2015-134718

Non Patent Literature

NPL 1: A T Collins, Vacancy enhanced aggregation of nitrogen in diamond, Journal of Physics C: Solid State Physics, the Institute of Physics, U K, 1980, No. 13, p 2641-50

SUMMARY OF INVENTION

A synthetic single crystal diamond according to an aspect of the present disclosure contains nitrogen atoms at a concentration of more than 600 ppm and 1500 ppm or less, the Raman shift $\lambda'$ (cm$^{-1}$) of a peak in a primary Raman scattering spectrum of the synthetic single crystal diamond and the Raman shift $\lambda$ (cm$^{-1}$) of a peak in a primary Raman scattering spectrum of a synthetic type IIa single crystal diamond containing nitrogen atoms at a content of 1 ppm or less satisfy the following expression (1):

$$\lambda' - \lambda \geq -0.10 \tag{1}.$$

BRIEF DESCRIPTION OF DRAWINGS

FIG. 1 is a cross-sectional view schematically illustrating an example configuration of a sample chamber used for producing a synthetic single crystal diamond according to an aspect of the present disclosure.

DETAILED DESCRIPTION

Problem to be Solved by the Present Disclosure

PTL 1 and NPL 1 both relate to the techniques for converting isolated substitutional nitrogen atoms in type Ib synthetic diamond into aggregated nitrogen atoms, but the conversion rate is insufficient, which makes the chipping resistance of the obtained synthetic diamond insufficient.

Therefore, an object of the present disclosure is to provide a synthetic single crystal diamond having high hardness and excellent chipping resistance.

Advantageous Effect of the Present Disclosure

According to the above aspect, there is provided a synthetic single crystal diamond having high hardness and excellent chipping resistance.

[Description of Aspects]

First, a description will be given on each aspect of the present disclosure.

(1) The synthetic single crystal diamond according to an aspect of the present disclosure contains nitrogen atoms at a concentration of more than 600 ppm and 1500 ppm or less, and the Raman shift $\lambda'$ (cm$^{-1}$) of a peak in a primary Raman scattering spectrum of the synthetic single crystal diamond and the Raman shift $\lambda$ (cm$^{-1}$) of a peak in a primary Raman scattering spectrum of a synthetic type IIa single crystal diamond containing nitrogen atoms at a content of 1 ppm or less satisfy the following expression (1):

$$\lambda' - \lambda \geq -0.10 \tag{1}.$$

The synthetic single crystal diamond of the above aspect has high hardness and excellent chipping resistance because the tensile stress in the crystal is small.

(2) The synthetic single crystal diamond preferably has a cracking load of 10 N or more in a breaking strength test in which a spherical diamond indenter having a tip radius of 50 μm is pressed against a surface of the synthetic single crystal diamond at a loading speed of 100 N/min. When the cracking load is 10 N or more, the synthetic single crystal diamond has excellent breaking strength and chipping resistance, and when it is used as a material in a cutting tool, the cutting tool may cut any difficult-to-cut hard material without causing the chipping of the cutting edge.

(3) The synthetic single crystal diamond preferably has a Knoop hardness of 95 GPa or more in the <100> direction on the {001} plane. When the synthetic single crystal diamond having this hardness is used as a material in a tool, the wear resistance of the tool is improved.

Details of Embodiments of the Present Disclosure

Specific examples of a synthetic single crystal diamond according to an embodiment of the present disclosure will be described below with reference to the drawings.

<Synthetic Single Crystal Diamond>

A synthetic single crystal diamond according to an embodiment of the present disclosure contains nitrogen atoms at a concentration of more than 600 ppm and 1500 ppm or less, and the Raman shift $\lambda'$ ($cm^{-1}$) of a peak in a primary Raman scattering spectrum of the synthetic single crystal diamond, and the Raman shift $\lambda$ ($cm^{-1}$) of a peak in a primary Raman scattering spectrum of a synthetic type IIa single crystal diamond containing nitrogen atoms at a content of 1 ppm or less satisfy the following expression (1):

$$\lambda' - \lambda \geq -0.10 \qquad (1).$$

One important factor that affects the wear resistance and the chipping resistance of diamond is the state of internal stress in the diamond crystal. When a tensile stress is present in the diamond crystal, the diamond crystal is likely to undergo plastic deformation or fracture starting from the point where the tensile stress is present, which deteriorates the wear resistance and the chipping resistance. On the contrary, when a compressive stress is present in the diamond crystal, the chipping resistance is improved. Therefore, the wear resistance and the chipping resistance of the single crystal diamond can be improved by adjusting the state of internal stress in the diamond crystal to lower the tensile stress as small as possible or to make the compressive stress dominant.

The state of internal stress in the synthetic single crystal diamond may be evaluated by comparing the Raman shift $\lambda'$ ($cm^{-1}$) of a peak in a primary Raman scattering spectrum of the synthetic single crystal diamond with the Raman shift $\lambda$ ($cm^{-1}$) of a peak in a primary Raman scattering spectrum of a synthetic type IIa single crystal diamond containing nitrogen atoms at a content of 1 ppm or less (hereinafter also referred to as a reference standard or a synthetic type IIa single crystal diamond). Specifically, the state of internal stress in the synthetic single crystal diamond may be evaluated by the shift amount of peak positions represented by the difference ($\lambda'-\lambda$) between $\lambda'$ and $\lambda$. The reason will be described hereinafter.

First, nitrogen atoms present as impurities in the crystal, which is one of the main factors of internal stress in diamond crystals, will be described. Nitrogen atoms in a single crystal diamond may be classified into isolated substitutional nitrogen atoms, aggregated nitrogen atoms and the like, depending on the form of existence.

Isolated substitutional nitrogen atoms refer to those atoms that each replaces a carbon atom in a diamond crystal and exists at the position of the carbon atom as an atomic unit. Isolated substitutional nitrogen atoms do not greatly affect the crystal structure of the single crystal diamond, and therefore will not contribute to the suppression of crack propagation. Further, an isolated substitutional nitrogen atom present in the diamond crystal will generate a local tensile stress around its crystal lattice. Therefore, a tensile stress is present in the diamond crystal containing isolated substitutional nitrogen atoms. Thus, the vicinity of a place where isolated substitutional nitrogen atoms are present becomes a starting point of plastic deformation or fracture, which thereby deteriorates the wear resistance and the chipping resistance of the diamond crystal.

Aggregated nitrogen atoms refer to those atoms that are present in a diamond crystal in an aggregate of two or more nitrogen atoms. Unlike isolated substitutional nitrogen atoms, aggregated nitrogen atoms can suppress the propagation of cracks in a single crystal diamond. In addition, aggregated nitrogen atoms in the diamond crystal do not generate a tensile stress, and thus will not deteriorate the wear resistance and the chipping resistance of the diamond crystal. Furthermore, the aggregated nitrogen atoms in the diamond crystal may generate a compressive stress as the amount thereof exceeds a certain amount, which may improve the wear resistance and the chipping resistance of the diamond crystal in certain circumstances.

Aggregated nitrogen atoms may be further classified into categories such as 2-nitrogen atom pairs, 4-nitrogen atom aggregates and platelets.

A 2-nitrogen atom pair is one in which two nitrogen atoms are covalently bonded and replace corresponding carbon atoms. A diamond containing 2-nitrogen atom pairs is called type IaA diamond.

A 4-nitrogen atom aggregate is one in which four nitrogen atoms are present adjacent to one vacancy and replace corresponding carbon atoms. A diamond containing 4-nitrogen atom aggregates is called type IaB diamond.

The platelet is one in which five or more nitrogen atoms are aggregated and replace corresponding carbon atoms. A diamond containing platelets is called type IaB' diamond.

Next, the relationship between nitrogen atoms in the diamond crystal and the primary Raman scattering spectrum of the diamond crystal will be described.

The synthetic type IIa single crystal diamond used as a reference standard refers to such a single crystal diamond that is synthesized by a temperature difference process under high temperature and high pressure and has high purity without any lattice defects or any internal strains. As an example, a commercially available high-purity type IIa single crystal diamond manufactured by Sumitomo Electric Co., Ltd. may be given. Since the content of nitrogen atoms is 1 ppm or less, which means that the synthetic type IIa single crystal diamond contains almost no nitrogen atoms, no internal stress is present in the diamond crystal. In the primary Raman scattering spectrum, the synthetic type IIa single crystal diamond shows a sharp and strong single peak. Generally, the Raman shift of this peak appears in the range of 1332 $cm^{-1}$ to 1333 $cm^{-1}$. The value of the Raman shift varies in accordance with the temperature of the measurement environment. In the present specification, the Raman shift is measured at room temperature (20° C. or more and 25° C. or less).

When isolated substitutional nitrogen atoms are present in the diamond crystal, the Raman shift thereof shifts to a frequency lower than that of the synthetic type IIa single crystal diamond. At this state, a tensile stress is generated in the diamond crystal due to the presence of the isolated substitutional nitrogen atoms. On the contrary, when no isolated substitutional nitrogen atoms but aggregated nitrogen atoms are present in the diamond crystal, the Raman shift shifts to a frequency higher than that of the synthetic type IIa single crystal diamond. At this state, no tensile stress is generated or a compressive stress is generated in the diamond crystal.

Therefore, the state of internal stress in the synthetic single crystal diamond may be evaluated by comparing the Raman shift $\lambda'$ (cm$^{-1}$) of the synthetic single crystal diamond and the Raman shift $\lambda$ (cm$^{-1}$) of the synthetic type IIa single crystal diamond.

Based on the above findings and after thorough investigation on the relationship between the shift amount of peak positions represented by the difference ($\lambda'-\lambda$) of $\lambda'$ (cm$^{-1}$) and $\lambda$ (cm$^{-1}$) and the chipping resistance and hardness of diamond of a synthetic single crystal diamond, the present inventors have found that when the difference ($\lambda'-\lambda$) satisfies the following expression (1), the synthetic single crystal diamond has high hardness and excellent chipping resistance.

$$\lambda'-\lambda \geq -0.10 \quad (1)$$

When the difference ($\lambda'-\lambda$) satisfies the above expression (1), the amount of isolated substitutional nitrogen atoms in the synthetic single crystal diamond is sufficiently reduced, and thereby the synthetic single crystal diamond has excellent chipping resistance and high hardness. It is preferable that the difference ($\lambda'-\lambda$) further satisfies the following expression (2) or (3) from the viewpoint of improving the chipping resistance.

$$\lambda'-\lambda \geq 0.00 \quad (2)$$

$$\lambda'-\lambda \geq 0.10 \quad (3)$$

The Raman shift of the peak of the synthetic single crystal diamond and the Raman shift of the peak of the reference standard in the primary Raman scattering spectrum may be measured with a micro-Raman spectrometer. The measurement is performed at room temperature (20° C. or more and 25° C. or less) using a laser having a wavelength of 532 nm as excitation light.

For the synthetic single crystal diamond, an arbitrary surface of the sample is polished, and the Raman shift ($\lambda'$) of the peak in the primary Raman scattering spectrum of the polished surface is measured. For the reference standard, an arbitrary surface of the high-purity synthetic type IIa single crystal diamond is polished, and the Raman shift ($\lambda$) of the peak in the primary Raman scattering spectrum of the polished surface is measured.

$\lambda'$ and $\lambda$ each represents a wave number at which the primary Raman scattering spectrum intensity signal is the strongest. It is preferable that the peak shape is evaluated after peak fitting process using Lorentz function or Gaussian function. Moreover, it is preferable that the temperature fluctuation of a detector and an optical system in the micro-Raman spectrometer during the measurement of the sample and the reference standard is suppressed to ±1° C. or less.

The shift amount of peak positions may be obtained by calculating the value of ($\lambda'-\lambda$).

The synthetic single crystal diamond according to the present embodiment contains nitrogen atoms at a concentration of more than 600 ppm and 1500 ppm or less. Here, the concentration of nitrogen atoms is the concentration of nitrogen atoms in the synthetic single crystal diamond in terms of mass. The concentration of nitrogen atoms in the synthetic single crystal diamond may be measured by SIMS (Secondary Ion Mass Spectrometry). When the concentration of nitrogen atoms is 600 ppm or less, the nitrogen atoms hardly aggregate with each other, and the tendency for isolated substitutional nitrogen atoms to be present in the synthetic single crystal diamond increases, which makes the hardness and chipping resistance of the synthetic single crystal diamond insufficient. On the contrary, when the concentration of nitrogen atoms exceeds 1500 ppm, lattice defects in the synthetic single crystal diamond increase, which makes the hardness and chipping resistance of the synthetic single crystal diamond insufficient. The concentration of nitrogen atoms in the synthetic single crystal diamond is more preferably 620 ppm or more and 1300 ppm or less, and further preferably 800 ppm or more and 1000 ppm or less.

Preferably, the synthetic single crystal diamond has a cracking load of 10 N or more in a breaking strength test in which a spherical diamond indenter having a tip radius (R) of 50 μm is pressed against a surface of the synthetic single crystal diamond at a loading speed of 100 N/min. When the cracking load is 10 N or more, the synthetic single crystal diamond has excellent breaking strength and chipping resistance, and when it is used as a material in a cutting tool, the cutting tool may cut any difficult-to-cut hard material without causing the chipping of the cutting edge. The cracking load is more preferably 15N or more, and further preferably 20 N or more. The upper limit of the cracking load is not particularly limited, but from the viewpoint of production, it is preferably 50 N or less.

The breaking strength test is performed under the following conditions. A spherical diamond indenter with a tip radius (R) of 50 μm is pressed against the sample, a load is applied to the indenter at a loading speed of 100 N/min, and the load at the moment when a crack occurs in the sample (cracking load) is measured. The moment when a crack occurs is measured using an AE sensor. The larger the cracking load, the better the chipping resistance or defect resistance of the cutting edge when the synthetic single crystal diamond is used in a cutting tool. When an indenter with a tip radius (R) smaller than 50 μm is used as the measuring indenter, the sample is plastically deformed before a crack is generated, and the strength against cracks may not be measured accurately. On the contrary, an indenter with a tip radius (R) larger than 50 μm may be used to perform the measurement, but in this case, a greater load is required until a crack occurs and the contact area between the indenter and the sample increases, which may affect the measurement accuracy due to the surface accuracy of the sample and may greatly affect the crystal orientation of the crystal. Therefore, it is desirable to use an indenter with a tip radius (R) of 50 μm in the breaking strength test for a synthetic single crystal diamond.

The synthetic single crystal diamond according to the present embodiment preferably has a Knoop hardness of 95 GPa or more in the <100> direction on the {001} plane. In the present specification, a generic plane orientation including any crystallographically equivalent plane orientation is indicated by { }, and a generic direction including any crystallographically equivalent direction is indicated by < >. A synthetic single crystal diamond having a Knoop hardness of 95 GPa or more has higher hardness and superior wear resistance than natural diamond containing nitrogen. The Knoop hardness is more preferably 110 GPa or more and 130 GPa or less.

A method of calculating the Knoop hardness (hereinafter also referred to as HK having a unit of GPa) will be described. First, an indentation is made with a load F (N) in the <100> direction on the {001} plane of a synthetic single crystal diamond. The width "a" (μm) of the indentation is measured, and the Knoop hardness (HK) is calculated by the following expression (4).

$$HK = 14229 \times F/a^2 \qquad (4)$$

The synthetic single crystal diamond according to the present embodiment includes, as inclusions, at least one element selected from the group consisting of titanium (Ti), vanadium (V), chromium (Cr), manganese (Mn), iron (Fe), nickel (Ni), cobalt (Co), copper (Cu), Zirconium (Zr), niobium (Nb), molybdenum (Mo), ruthenium (Ru), rhodium (Rh), palladium (Pd), hafnium (Hf), tantalum (Ta), tungsten (W), osmium (Os), iridium (Ir) and platinum (Pt); at least one alloy containing two or more elements selected from the group; a compound composed of at least one element selected from the group and carbon (C) or oxygen (O); and at least one selected from the group consisting of composites containing at least one element, at least one alloy and the compound.

If the density or the size of the inclusions is large, the synthetic single crystal diamond bonded to a polishing substrate may be damaged due to the thermal expansion difference between the synthetic single crystal diamond and the polishing substrate, which may be a problem in practical use. Therefore, the density of the inclusions in the synthetic single crystal diamond is preferably 20 pieces/mm³ or less, and more preferably 10 pieces/mm³ or less. Further, the inclusion may preferably have a span diameter of 10 μm or less, and more preferably 5 μm or less. The span diameter refers to the maximum length of a straight line that can be drawn in a single crystal having a certain size and a certain shape. Most preferably, the synthetic single crystal diamond does not contain any inclusions.

<Tool>

The synthetic single crystal diamond according to an embodiment of the present disclosure has high hardness and excellent chipping resistance and is stable in quality, which makes it applicable in various applications. For example, the synthetic single crystal diamond can be used as a material for a wear-resistant tool such as a dresser, a wire drawing die, a scribe tool or a water jet orifice, or for a cutting tool such as a precision cutting tool or a wood cutter. A tool containing the synthetic single crystal diamond according to an embodiment of the present disclosure can perform stable processing for a longer time and thereby has a longer tool life than a tool produced from a conventional synthetic diamond, natural diamond or a diamond sintered body.

<Method of Producing Synthetic Single Crystal Diamond>

The synthetic single crystal diamond according to an embodiment of the present disclosure may be produced, for example, by the following method.

First, a diamond single crystal containing nitrogen atoms at a concentration of more than 600 ppm and 1500 ppm or less is obtained by a temperature difference process using a solvent metal (hereinafter also referred to as a temperature difference step). The diamond single crystal may be produced by a temperature difference process in a sample chamber having a configuration illustrated in FIG. 1, for example.

As illustrated in FIG. 1, in a sample chamber 10 used for the production of the diamond single crystal, an insulator 2, a carbon source 3, a solvent metal 4 and seed crystals 5 are disposed in a space surrounded by a graphite heater 7, and a pressure medium 6 is disposed outside the graphite heater 7. The temperature difference process is a synthesis process in which a temperature gradient in the vertical direction is provided inside the sample chamber 10, the carbon source 3 is disposed in a high temperature portion ($T_{high}$) and the seed crystals 5 are disposed in a low temperature portion ($T_{low}$), the solvent metal 4 is disposed between the carbon source 3 and the seed crystals 5, and a diamond single crystal (1) is grown on each of the seed crystals 5 by maintaining the temperature equal to or higher than a temperature at which the solvent metal 4 is dissolved and the pressure equal to or higher than a pressure at which the diamond is thermally stable.

As the carbon source 3, diamond powder is preferably used. In addition, graphite (black lead) or pyrolytic carbon may also be used. As the solvent metal 4, at least one metal selected from iron (Fe), cobalt (Co), nickel (Ni), manganese (Mn) and the like, or an alloy containing these metals may be used.

The carbon source 3 or the solvent metal 4 may include a nitrogen source which is added as a simple substance or a mixture of, for example, a nitride such as iron nitride ($Fe_2N$, $Fe_3N$), aluminum nitride (AlN), phosphorus nitride ($P_3N_4$) or silicon nitride ($Si_3N_4$), or an organic nitrogen compound such as melamine or sodium azide. Further, to the carbon source 3, diamond powder or graphite containing a large amount of nitrogen, or a compound having a carbon-nitrogen bond (C—N bond) may be added. Thereby, the synthesized diamond single crystal may contain nitrogen atoms, and the nitrogen atoms in the diamond single crystal exist mainly as isolated substitutional nitrogen atoms.

The content of the nitrogen source in the carbon source 3 or the solvent metal 4 may be adjusted so that the concentration of nitrogen atoms in the synthesized diamond single crystal is more than 600 ppm and 1500 ppm or less. For example, in the carbon source, the content of nitrogen atoms derived from the nitrogen source may be adjusted to 200 ppm or more and 3000 ppm or less. In the case of the solvent metal, for example, when the solvent metal is an alloy composed of iron, cobalt and nickel and the nitrogen source is $Fe_3N$, the content of the nitrogen source may be adjusted to 0.08 mass % or more and 0.2 mass % or less.

The solvent metal 4 may further contain at least one element selected from the group consisting of titanium (Ti), vanadium (V), chromium (Cr), manganese (Mn), copper (Cu), zirconium (Zr), niobium (Nb), molybdenum (Mo), ruthenium (Ru), rhodium (Rh), hafnium (Hf), tantalum (Ta), tungsten (W), osmium (Os), iridium (Ir), and platinum (Pt).

Next, the obtained diamond single crystal is irradiated with one or both of an electron beam and a particle beam with an energy of 100 MGy or more and 1000 MGy or less (hereinafter also referred to as an irradiation step). As a result, lattice defects are introduced into the diamond single crystal, and thereby vacancies are formed. As the particle beam, a neutron beam or a proton beam may be used.

If the amount of irradiation energy is less than 100 MGy, the introduction of lattice defects may be insufficient. On the contrary, if the amount of energy is greater than 1000 MGy, excessive vacancies may be formed, which may greatly deteriorate the crystallinity. Therefore, the amount of energy is preferably 100 MGy or more and 1000 MGy or less.

The irradiation conditions are not particularly limited as long as the amount of energy applied to the diamond single crystal is 100 MGy or more and 1000 MGy or less. For example, in the case of using an electron beam, the irradiation energy may be 4.6 MeV or more and 4.8 MeV or less, the current may be 2 mA or more and 5 mA or less, and the irradiation time may be 30 hours or more and 45 hours or less.

Next, the diamond single crystal irradiated with one or both of the electron beam and the particle beam is annealed at a temperature of 1700° C. or higher and 1800° C. or lower in vacuum or in an inert gas atmosphere under normal pressure (hereinafter, also referred to as an annealing step). Thereby, the isolated substitutional nitrogen atoms in the diamond single crystal move through the vacancies and aggregate with each other to form aggregated nitrogen atoms. As a result, the tensile stress present in the crystal is greatly reduced. Furthermore, the compressive stress may become dominant depending on the nitrogen content in the diamond single crystal, the irradiation conditions, the annealing conditions and the like.

If the annealing temperature is lower than 1700° C., the aggregation speed of nitrogen atoms is slow, and the annealing treatment is required to be performed for a longer time, which is not preferable. On the contrary, if the annealing temperature is higher than 1800° C., the aggregation speed of nitrogen atoms increases, but the diamond single crystal will be graphitized under normal pressure. Therefore, when the annealing treatment is performed at a temperature higher than 1800° C., it must be performed under ultra-high pressure where the diamond is thermodynamically stable, which is not preferable from the consideration of an increase in costs or a decrease in productivity. Accordingly, the annealing temperature is preferably 1700° C. or higher and 1800° C. or lower.

The irradiation step and the annealing step each may be performed twice or more. In addition, the irradiation step and the annealing step each may be performed once as one cycle, and the cycle may be repeated twice or more, which may promote the aggregation of isolated substitutional nitrogen atoms in the diamond single crystal. By performing the irradiation step and the annealing step sufficiently, all the isolated substitutional nitrogen atoms in the diamond single crystal may be converted into the aggregated nitrogen atoms.

Note that the synthetic single crystal diamond according to the present embodiment may be produced without performing the irradiation step. In this case, the annealing step is performed after the temperature difference step without performing the irradiation step.

Examples

The present disclosure will be described in more detail with reference to examples. However, the scope of the present disclosure is not limited to these examples.

<Production of Synthetic Single Crystal Diamond>
[Sample 1]
(Temperature Difference Step)

First, a diamond single crystal was synthesized in a sample chamber having the configuration illustrated in FIG. 1 by the temperature difference process using a solvent metal.

As the solvent metal, an alloy composed of iron, cobalt and nickel was prepared, and to the solvent metal, iron nitride ($Fe_3N$) powder was added as a nitrogen source. The concentration of iron nitride in the solvent metal was 0.08 mass %.

Diamond powder was used as the carbon source, and about 0.5 mg of diamond single crystal was used as the seed crystal. The temperature in the sample chamber was adjusted by using a heater so that a temperature difference of several tens of degrees was created between the high temperature portion where the carbon source was disposed and the low temperature portion where the seed crystal was disposed. In addition, a ultrahigh pressure generator was used to control the pressure to 5.5 GPa and the temperature of the low temperature portion in the range of 1370° C.±10° C. (1360° C. to 1380° C.), and the controlled pressure and temperature were kept for 60 hours, and thereby the diamond single crystal was synthesized on the seed crystal.

(Irradiation Step)

Next, the obtained diamond single crystal was irradiated with an electron beam. The irradiation condition was set to include an irradiation energy of 4.6 MeV, a current of 2 mA, and an irradiation time of 30 hours. This irradiation condition is the same as the irradiation condition for applying an energy of 100 MGy to a diamond single crystal.

(Annealing Step)

Next, the diamond single crystal after the electron beam irradiation was annealed at a temperature of 1700° C. for 1 hour in vacuum under normal pressure, and thereby a synthetic single crystal diamond was obtained.

[Samples 2 to 21]
(Temperature Difference Step)

Diamond single crystals were produced for samples 2 to 21 by the temperature difference step in the same manner as sample 1. The difference between samples 2 to 21 and sample 1 is the amount of iron nitride ($Fe_3N$) powder added to the solvent metal, i.e., the concentration of iron nitride in the solvent metal listed in the column "concentration of iron nitride in solvent metal" in Table 1.

(Irradiation Step)

The diamond single crystals for samples 5 to 15 were irradiated with the electron beam under the same irradiation conditions as sample 1. The diamond single crystals for samples 2 to 4 and 16 to 21 were not irradiated with the electron beam.

(Annealing Step)

The diamond single crystals for samples 2 to 15 and 18 were subjected to the annealing step for 1 hour at respective temperatures listed in the column "annealing temperature" in Table 1. The diamond single crystals for samples 16, 17 and 19 to 21 were not subjected to the annealing step.

The diamond single crystals for samples 2 to 7, 10, 12 and 18 were subjected to the electron beam irradiation step and the annealing step each for one time (one cycle). The diamond single crystals for samples 8, 11 and 13 to 15 were subjected to the electron beam irradiation step and the annealing step in this order for two times (two cycles). The diamond single crystal for sample 9 was subjected to the electron beam irradiation step and the annealing step in this order for three times (three cycles). After the above steps, the synthetic single crystal diamonds for samples 2 to 21 were produced. Samples 1 to 13 correspond to examples, and samples 14 to 21 correspond to comparative examples.

TABLE 1

| | Temperature Difference Step | Post-Synthesis Conditions | | | Synthetic Single Crystal Diamond | | | |
|---|---|---|---|---|---|---|---|---|
| Sample No. | Iron nitride concentration in solvent metal (mass %) | Electron beam irradiation (100 MGy) | Annealing temperature (° C.) | Cycle | Nitrogen concentration (ppm) | Shift amount of peak positions ($\lambda'$ - $\lambda$) ($cm^{-1}$) | Knoop hardness (GPa) | Cracking load (N) |
| 1 | 0.08 | YES | 1700° C. | 1 | 620 | 0.27 | 95 | 12 |
| 2 | 0.1 | NO | 1600° C. | 1 | 800 | −0.10 | 95 | 10 |

TABLE 1-continued

| | Temperature Difference Step | Post-Synthesis Conditions | | | Synthetic Single Crystal Diamond | | | |
|---|---|---|---|---|---|---|---|---|
| Sample No. | Iron nitride concentration in solvent metal (mass %) | Electron beam irradiation (100 MGy) | Annealing temperature (° C.) | Cycle | Nitrogen concentration (ppm) | Shift amount of peak positions ($\lambda'$ - $\lambda$) (cm$^{-1}$) | Knoop hardness (GPa) | Cracking load (N) |
| 3 | 0.1 | NO | 1700° C. | 1 | 800 | −0.05 | 105 | 12 |
| 4 | 0.1 | NO | 1800° C. | 1 | 800 | −0.03 | 115 | 12 |
| 5 | 0.1 | YES | 1700° C. | 1 | 800 | 0.05 | 120 | 13 |
| 6 | 0.1 | YES | 1800° C. | 1 | 800 | 0.00 | 125 | 21 |
| 7 | 0.13 | YES | 1700° C. | 1 | 1000 | −0.08 | 110 | 12 |
| 8 | 0.13 | YES | 1700° C. | 2 | 1000 | 0.12 | 122 | 18 |
| 9 | 0.13 | YES | 1700° C. | 3 | 1000 | 0.33 | 130 | 22 |
| 10 | 0.17 | YES | 1700° C. | 1 | 1300 | −0.05 | 115 | 15 |
| 11 | 0.17 | YES | 1700° C. | 2 | 1300 | 0.35 | 125 | 23 |
| 12 | 0.2 | YES | 1700° C. | 1 | 1500 | −0.05 | 120 | 20 |
| 13 | 0.2 | YES | 1700° C. | 2 | 1500 | 0.40 | 130 | 25 |
| 14 | 0.03 | YES | 1700° C. | 2 | 250 | −0.11 | 97 | 5 |
| 15 | 0.07 | YES | 1700° C. | 2 | 500 | −0.13 | 93 | 7 |
| 16 | 0.08 | NO | NO | — | 620 | −0.15 | 92 | 5 |
| 17 | 0.1 | NO | NO | — | 800 | −0.17 | 90 | 3 |
| 18 | 0.1 | NO | 1500° C. | 1 | 800 | −0.13 | 93 | 6 |
| 19 | 0.13 | NO | NO | — | 1000 | −0.46 | 90 | 6 |
| 20 | 0.17 | NO | NO | — | 1300 | −0.49 | 85 | 6 |
| 21 | 0.2 | NO | NO | — | 1500 | −0.51 | 82 | 8 |

<Evaluation of Synthetic Single Crystal Diamond>

The obtained synthetic single crystal diamond was subjected to measurement of nitrogen concentration, Raman spectroscopy, Knoop hardness measurement, and breaking strength test.

(Determination of Nitrogen Concentration)

The nitrogen concentration in the synthetic single crystal diamond of each sample was determined by SIMS analysis. The results are listed in Table 1.

(Raman Spectroscopy)

For each sample and the reference standard (high-purity type IL single crystal diamond manufactured by Sumitomo Electric Co., Ltd.), the Raman shift of the peak in the primary Raman scattering spectrum was measured with a micro-Raman spectrometer. The measurement was performed at room temperature (20° C.) using a laser having a wavelength of 532 nm as the excitation light.

For the synthetic single crystal diamond, an arbitrary surface of the sample was polished, and the Raman shift ($\lambda'$) of the peak in the primary Raman scattering spectrum of the polished surface was measured. For the reference standard, an arbitrary surface of the high-purity synthetic type IIa single crystal diamond was polished, and the Raman shift ($\lambda$) of the peak in the primary Raman scattering spectrum of the polished surface was measured. $\lambda'$ and $\lambda$ each represents a wave number at which the primary Raman scattering spectrum intensity signal is the strongest after the peak shape of the primary Raman scattering spectrum intensity signal was subjected to peak fitting process using Lorentz function. In addition, the temperature fluctuation of the micro-Raman spectrometer during the measurement of the sample and the reference standard was suppressed to ±1° C. or less.

The shift amount of peak positions was determined by calculating the value of ($\lambda'$−$\lambda$). The results are listed in Table 1.

(Measurement of Knoop Hardness)

The Knoop hardness was obtained in the following manner: an indentation was made with a load of 4.9 N in the <100> direction on the {001} plane of the synthetic single crystal diamond, the width "a" of the indentation was measured, and the Knoop hardness (HK) was calculated by the following expression (4). The results are listed in Table 1.

$$HK = 14229 \times 4.9/a^2 \qquad (4)$$

(Breaking Strength Test)

A spherical diamond indenter having a tip radius R of 50 µm was prepared, a load was applied to each sample at a loading speed of 100 N/min at room temperature (23° C.), and the load at the moment when a crack occurred in the sample (cracking load) was measured. The moment when the crack occurred was measured using an AE sensor. The larger the cracking load, the higher the strength of the sample and the better the chipping resistance. The results are listed in Table 1.

The synthetic single crystal diamonds of samples 1 to 13 each has a nitrogen concentration in the range of more than 600 ppm and 1500 ppm or less, and satisfies the relationship of ($\lambda'$−$\lambda$)≥−0.10, which corresponds to the example. These synthetic single crystal diamonds had high hardness and excellent chipping resistance.

The synthetic single crystal diamonds of samples 14 to 21 each has a nitrogen concentration in the range of 250 ppm to 1500 ppm, and the difference ($\lambda'$−$\lambda$) is −0.11 or less, which corresponds to the comparative example. These synthetic single crystal diamonds have insufficient chipping resistance.

It should be understood that the embodiments and examples disclosed herein have been presented for the purpose of illustration and description but not limited in all aspects. It is intended that the scope of the present disclosure is not limited to the description above but defined by the scope of the claims and encompasses all modifications equivalent in meaning and scope to the claims.

REFERENCE SIGNS LIST

1: single crystal diamond; 2: insulator; 3: carbon source; 4: solvent metal; 5: seed crystal; 6: pressure medium; 7: graphite heater

The invention claimed is:

1. A synthetic single crystal diamond containing nitrogen atoms at a concentration of more than 600 ppm and 1500 ppm or less, the Raman shift $\lambda'$ ($cm^{-1}$) of a peak in a primary Raman scattering spectrum of the synthetic single crystal diamond and the Raman shift $\lambda$($cm^{-1}$) of a peak in a primary Raman scattering spectrum of a synthetic type IIa single crystal diamond containing nitrogen atoms at a content of 1 ppm or less satisfying the following expression (1):

$$\lambda' - \lambda \geq -0.10 \tag{1}.$$

2. The synthetic single crystal diamond according to claim 1, wherein the synthetic single crystal diamond has a cracking load of 10 N or more in a breaking strength test in which a spherical diamond indenter having a tip radius of 50 μm is pressed against a surface of the synthetic single crystal diamond at a loading speed of 100 N/min.

3. The synthetic single crystal diamond according to claim 1, wherein the synthetic single crystal diamond has a Knoop hardness of 95 GPa or more in a <100> direction on a {001} plane.

* * * * *